United States Patent
Maruyama et al.

(10) Patent No.: US 12,282,048 B2
(45) Date of Patent: Apr. 22, 2025

(54) DATA COLLECTION SYSTEM, AUXILIARY POWER SUPPLY, AND MONITORING DEVICE

(71) Applicant: Mitsubishi Electric Corporation, Tokyo (JP)

(72) Inventors: Tomohisa Maruyama, Tokyo (JP); Toshiaki Takeoka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 294 days.

(21) Appl. No.: 17/632,570

(22) PCT Filed: Aug. 8, 2019

(86) PCT No.: PCT/JP2019/031413
§ 371 (c)(1),
(2) Date: Feb. 3, 2022

(87) PCT Pub. No.: WO2021/024462
PCT Pub. Date: Feb. 11, 2021

(65) Prior Publication Data
US 2022/0221496 A1     Jul. 14, 2022

(51) Int. Cl.
*G01R 21/06* (2006.01)
*B61L 3/00* (2006.01)
(Continued)

(52) U.S. Cl.
CPC .......... *G01R 21/06* (2013.01); *B61L 15/0058* (2024.01); *B61L 15/0094* (2024.01); *G01R 31/40* (2013.01)

(58) Field of Classification Search
CPC ..... G01R 21/06; G01R 31/40; B61L 15/0058; B61L 15/0094; B61L 15/0081; B60L 2200/26; B60L 1/00; B60L 3/12
See application file for complete search history.

(56) References Cited

U.S. PATENT DOCUMENTS

2008/0309163 A1* 12/2008 Hashimoto ......... H02J 7/00308
361/86
2010/0147184 A1* 6/2010 Kitanaka ............. H02P 29/0241
236/49.3
(Continued)

FOREIGN PATENT DOCUMENTS

JP   2002037075 A   2/2002
JP   2011078174 A   4/2011
(Continued)

OTHER PUBLICATIONS

English translation of KR 101575518 B1 (Year: 2015).*
(Continued)

*Primary Examiner* — Giovanni Astacio-Oquendo
*Assistant Examiner* — Haidong Zhang
(74) *Attorney, Agent, or Firm* — Buchanan Ingersoll & Rooney PC

(57) ABSTRACT

A data collection system includes: a monitoring device that sequentially instructs two or more in-vehicle devices installed in a railroad car to start operating and to stop operating; and an auxiliary power supply that sequentially measures an output voltage and an output current while the in-vehicle devices operate in turns in accordance with an instruction from the monitoring device, and records measurement results.

20 Claims, 10 Drawing Sheets

(51) Int. Cl.
 *B61L 15/00* (2006.01)
 *G01R 31/40* (2020.01)

(56) References Cited

U.S. PATENT DOCUMENTS

| | | | |
|---|---|---|---|
| 2011/0166736 A1* | 7/2011 | Kitanaka | B60L 15/20 |
| | | | 701/22 |
| 2012/0109429 A1* | 5/2012 | Shiota | B61D 27/0072 |
| | | | 701/19 |
| 2013/0184905 A1* | 7/2013 | Hatanaka | B60W 10/08 |
| | | | 701/19 |
| 2015/0165930 A1 | 6/2015 | Sawa et al. | |
| 2016/0129925 A1* | 5/2016 | Jensen | B61L 15/0058 |
| | | | 701/19 |
| 2016/0152158 A1* | 6/2016 | Yamashita | B61L 15/0058 |
| | | | 701/19 |
| 2017/0015338 A1 | 1/2017 | Sawa et al. | |
| 2017/0369084 A1* | 12/2017 | Goda | G06F 9/44505 |

FOREIGN PATENT DOCUMENTS

| | | |
|---|---|---|
| JP | 2012101602 A | 5/2012 |
| KR | 101098044 B1 | 12/2011 |
| KR | 101575518 B1 * | 12/2015 |
| WO | 2014027400 A1 | 2/2014 |
| WO | 2015136628 A1 | 9/2015 |

OTHER PUBLICATIONS

International Search Report (PCT/ISA/210) with translation and Written Opinion (PCT/ISA/237) mailed on Nov. 12, 2019, by the Japan Patent Office as the International Searching Authority for International Application No. PCT/JP2019/031413.
Office Action issued in corresponding Indian Patent Application No. 202227005636, mailed on Feb. 24, 2023, 5 pages.
Notice of Reasons for Refusal dated Mar. 1, 2022, issued in corresponding Japanese Application No. 2021-538654, 5 pages including 3 pages of English Translation.

* cited by examiner

DATA COLLECTION SYSTEM, AUXILIARY POWER SUPPLY, AND MONITORING DEVICE

FIELD

The present invention relates to a data collection system, an auxiliary power supply, a monitoring device, and a data collecting method, which are to be provided to a railroad car.

BACKGROUND

Conventionally, periodic maintenance of railroad cars has been performed to prevent failure so that any failure would not occur during operation of the cars. Various devices, however, are installed in the railroad cars, and large amounts of labor and cost are needed for periodic inspection of the devices. There have therefore been demands for measuring and recording operation states of the devices in the railroad cars in the process of operation of the cars, so as to reduce a possible burden caused when the periodic inspection is performed. Patent Literature 1 discloses a technique for reading and recording signals containing operation statuses of railroad cars in predetermined periods. A recording device described in Patent Literature 1 can perform stable recording by recording the signal using a device provided with a battery even under an unstable condition such as a situation of power-on, which is difficult to grasp.

CITATION LIST

Patent Literature

Patent Literature 1: Japanese Patent Application Laid-open No. 2012-101602

SUMMARY

Technical Problem

According to the aforementioned prior art technique, however, the state of a device operating under a specific operation condition such as a situation in which a railroad car is powered on can be recorded, but the state of a device that is not operating at this time cannot be recorded. There has therefore been a problem in that recording of an operation state is confined to only some of the devices.

The present invention has been made in view of the above circumstances, and an object thereof is to provide a data collection system capable of recording the state of an in-vehicle device installed in a railroad car at desired timing.

Solution to Problem

In order to solve the above-mentioned problems and achieve the object, the present invention provides a data collection system comprising: a monitoring device to sequentially instruct two or more in-vehicle devices installed in a railroad car to start operating and to stop operating; and an auxiliary power supply to sequentially measure an output voltage and an output current while the in-vehicle devices operate in turns in accordance with an instruction from the monitoring device, and record measurement results.

Advantageous Effects of Invention

According to the present invention, the data collection system produces an advantageous effect that it can record the state of an in-vehicle device installed in a railroad car at a desired timing.

DESCRIPTION OF EMBODIMENTS

A data collection system, an auxiliary power supply, a monitoring device, and a data collecting method according to embodiments of the present invention will be described in detail below with reference to the drawings. Note that the invention is not necessarily limited by these embodiments.

First Embodiment

Figure 1:
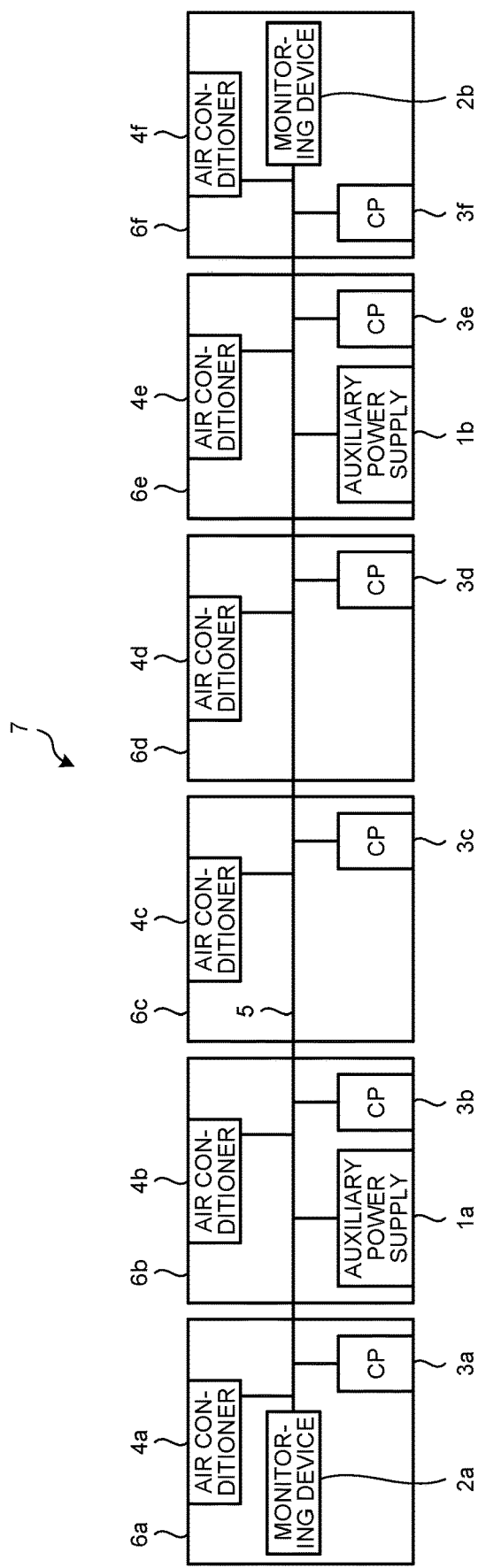
FIG. 1 is a diagram illustrating an example of a configuration of a train including auxiliary power supplies and monitoring devices according to a first embodiment.

FIG. 1 is a diagram illustrating an example of a configuration of a train 7 having therein auxiliary power supplies 1a and 1b and monitoring devices 2a and 2b according to a first embodiment of the present invention. The train 7 is constituted by railroad cars 6a to 6f.

The monitoring device 2a, a brake compressor 3a, and an air conditioner 4a are installed in the railroad car 6a. The auxiliary power supply 1a, a brake compressor 3b, and an air conditioner 4b are installed in the railroad car 6b. A brake compressor 3c and an air conditioner 4c are installed in the railroad car 6c. A brake compressor 3d and an air conditioner 4d are installed in the railroad car 6d. The auxiliary power supply 1b, a brake compressor 3e, and an air conditioner 4e are installed in the railroad car 6e. The monitoring device 2b, a brake compressor 3f, and an air conditioner 4f are installed in the railroad car 6f. Note that, in FIG. 1, the brake compressor is notated as "CP". As illustrated in FIG. 1, in-vehicle devices such as the auxiliary power supplies 1a and 1b, the monitoring devices 2a and 2b, the brake compressors 3a to 3f, and the air conditioners 4a to 4f are connected to each other by communication lines 5, and can communicate with the other in-vehicle devices via the communication lines 5.

As illustrated in FIG. 1, the train 7 has a redundant configuration including two auxiliary power supplies 1a and 1b and two monitoring devices 2a and 2b. For the train 7 that is in the process of operation, it is sufficient that at least one of the two auxiliary power supplies 1a and 1b works, and at least one of the two monitoring devices 2a and 2b works.

In the following description, the auxiliary power supplies 1a and 1b may be referred to as auxiliary power supply or supplies 1 when they are not distinguished from each other, case by case and the monitoring devices 2a and 2b may be referred to as monitoring device or devices 2 when they are not distinguished from each other, case by case. In addition, in the following description, the brake compressors 3a to 3f may be referred to as brake compressor or compressors 3 when they are not distinguished from each other, case by case and the air conditioners 4a to 4f may be referred to as air conditioner or conditioners 4 when they are not distinguished from each other, case by case, while the railroad cars 6a to 6f may be referred to as railroad car or cars 6 when they are not distinguished from each other, case by case. Note that any in-vehicle devices other than the brake compressors 3 and the air conditioners 4 may be installed in the railroad cars 6 of the train 7. In addition, although the train 7 is constituted by six cars in the example of FIG. 1, this is merely one form and the invention is not limited to this form. The train 7 may be constituted by five or less cars, or seven or more cars.

In the present embodiment, the auxiliary power supply 1 operates in cooperation with the monitoring device 2 to measure and record, at a prescribed timing or at a timing specified by a user, an output voltage and an output current from the auxiliary power supply 1 when each in-vehicle device is operated. Note that the auxiliary power supply 1 may measure the temperature around the auxiliary power supply 1 using a thermistor (not illustrated) or the like in addition to measuring the output voltage and the output current. In this case, the auxiliary power supply 1 records the temperature in association with the output voltage and the output current. The monitoring device 2 sequentially instructs a plurality of in-vehicle devices installed in the railroad cars 6 to start operating and to stop operating. The auxiliary power supply 1 sequentially measures the output voltage and the output current while in-vehicle devices operate in turns in response to instructions from the monitoring device 2, and records measurement results that are results of the measurements. Specific configurations and operations of the auxiliary power supply 1 and the monitoring device 2 will be described.

Figure 2:
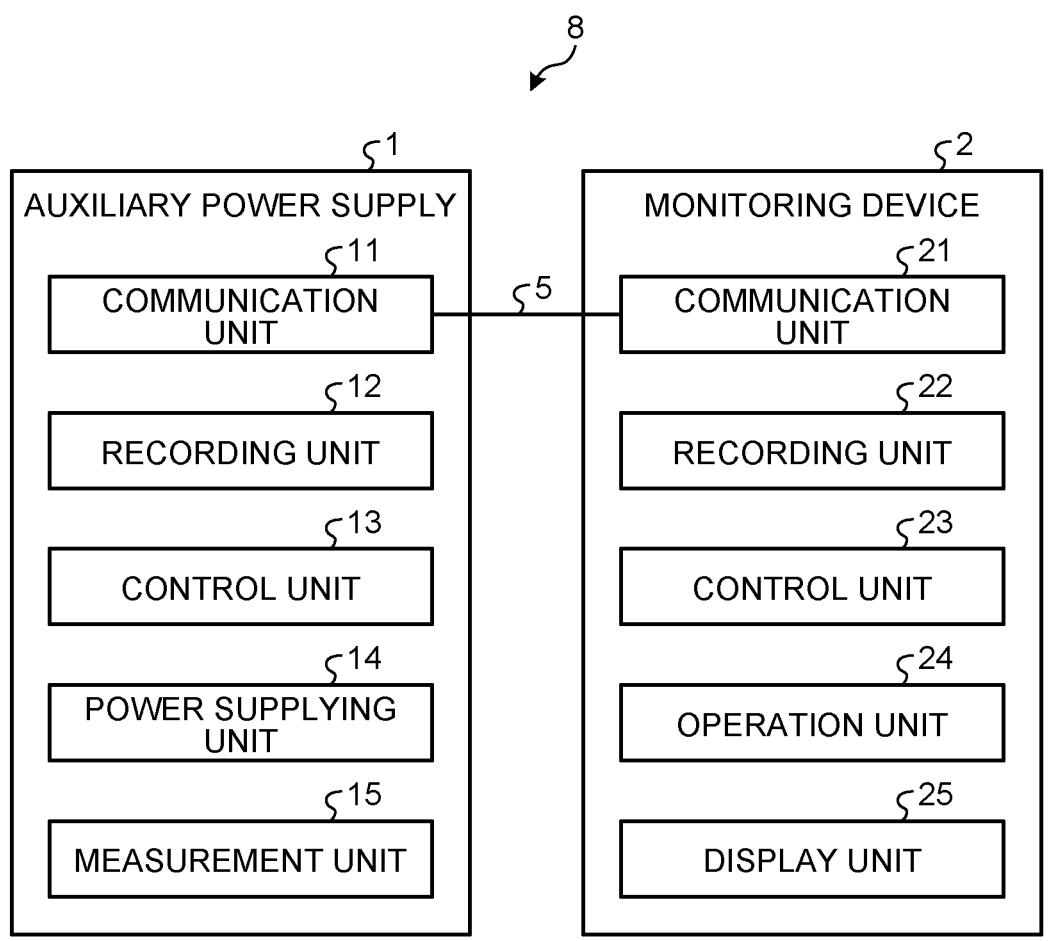
FIG. 2 is a diagram illustrating an example of configurations of the auxiliary power supply and the monitoring device according to the first embodiment.

FIG. 2 is a diagram illustrating an example of configurations of the auxiliary power supply 1 and the monitoring device 2 according to the first embodiment. In the train 7, the auxiliary power supplies 1 and the monitoring devices 2 constitute a data collection system 8.

First, the configuration of the auxiliary power supply 1 will be described. As illustrated in FIG. 2, the auxiliary power supply 1 includes a communication unit 11, a recording unit 12, a control unit 13, a power supplying unit 14, and a measurement unit 15.

The communication unit 11 communicates with the monitoring device 2 via the communication lines 5. As a method of communication via the communication lines 5, any existing communication method used in common railroad cars can be adopted.

In the recording unit 12, measurement results, which are results of measurement performed by the measurement unit 15, and information on the instruction order in which the monitoring device 2 instructs the in-vehicle devices are recorded. The information on the instruction order is set by a user or the like and recorded in advance in the recording unit 12.

The control unit 13 instructs the measurement unit 15 on a measurement timing for measurement, and records results of measurement of the measurement unit 15 in the recording unit 12 on the basis of the information on the instruction order.

The power supplying unit 14 supplies power to the in-vehicle devices. In practice, the power supplying unit 14 converts electric power taken from an overhead line, which is not illustrated, via a pantograph into electric power that can be used by two or more in-vehicle devices, and supplies the electric power to the in-vehicle devices.

The measurement unit 15 sequentially measures the output voltage and the output current from the power supplying unit 14 in a situation where in-vehicle devices operate in turns in accordance with the instruction from the monitoring device 2.

Next, a configuration of the monitoring device 2 will be described. As illustrated in FIG. 2, the monitoring device 2 includes a communication unit 21, a recording unit 22, a control unit 23, an operation unit 24, and a display unit 25.

The communication unit 21 communicates with the auxiliary power supplies 1 and two or more in-vehicle devices via the communication lines 5.

In the recording unit 22, information on the instruction order in which the in-vehicle devices installed in the railroad cars 6 are instructed to start operating and to stop operating is recorded. The information on the instruction order is set by a user or the like and recorded in advance in the recording unit 22.

The control unit 23 sequentially instructs the in-vehicle devices to start operating and to stop operating on the basis of the information on the instruction order recorded in the recording unit 22.

The operation unit 24 receives an operation performed by a user, that is, specifically, an instruction to each of the in-vehicle devices to start measurement.

The display unit 25 displays operation states of the in-vehicle devices. In addition, the display unit 25 displays a measurement result acquired from the auxiliary power supply 1.

Next, description is given for an operation of the auxiliary power supply 1 measuring the output voltage and the output current from the power supplying unit 14 when the monitoring device 2 has caused the in-vehicle devices to operate in the train 7.

Figure 3:
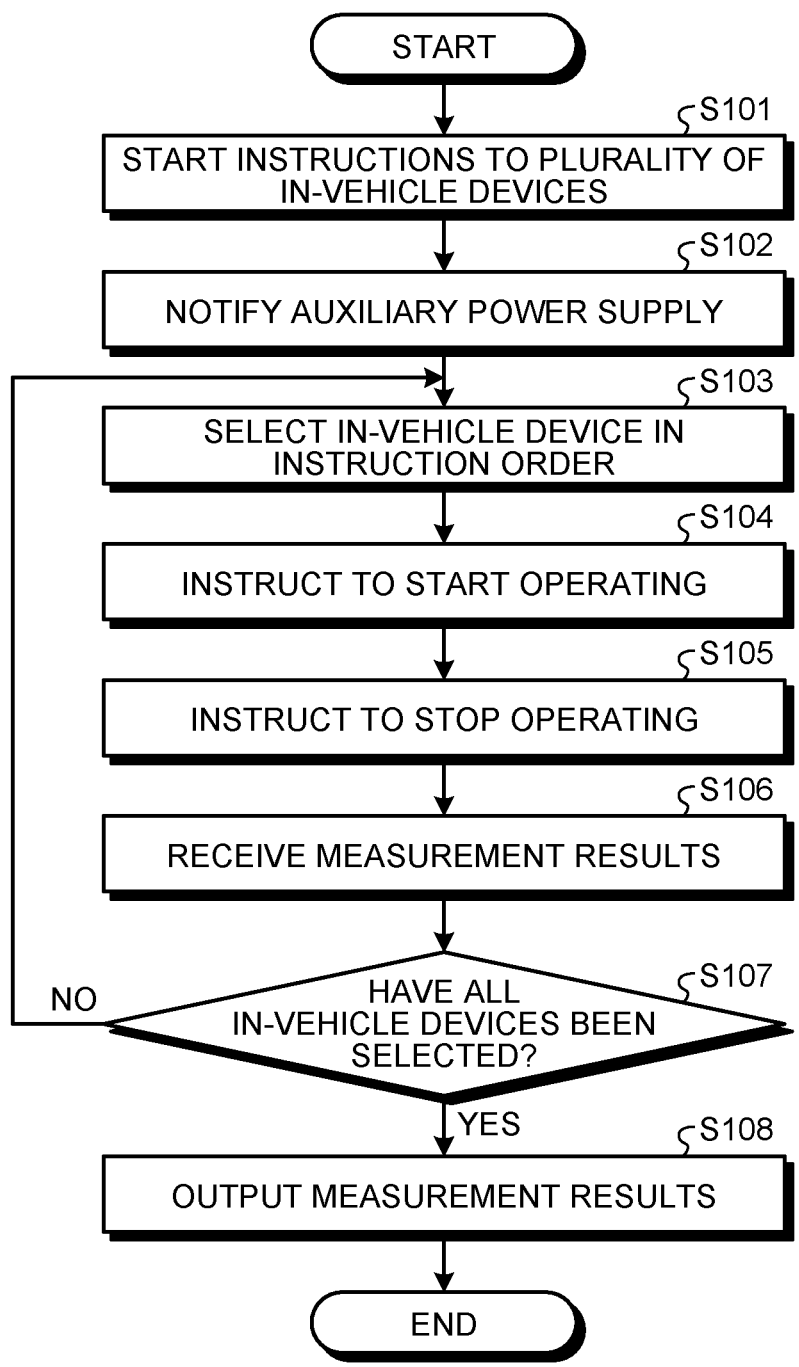
FIG. 3 is a flowchart illustrating an operation of the monitoring device according to the first embodiment.

FIG. 3 is a flowchart illustrating an operation of the monitoring device 2 according to the first embodiment. In the monitoring device 2, when a prescribed event has occurred, when an instruction from a user has been received, or when an instruction from the auxiliary power supply 1 has been received, the control unit 23 starts instruction to the in-vehicle devices (step S101). A prescribed event corresponds to a case where the railroad cars 6 are powered on, a case where the railroad cars 6 are stored, or a case where an operation condition of the in-vehicle device to be measured meets a prescribed operation condition during operation of the railroad cars 6. A prescribed event to be targeted by the monitoring device 2 may also be referred to as a first event.

The case where the railroad cars 6 are powered on means the time of start of operation of the railroad cars 6, that is, the train 7. The case where the railroad cars 6 are stored is a case where the railroad cars 6, that is, the train 7 is temporarily stored on a storage track or the like after the start of operation of the train 7 and before the operation of the day is completed. The case where an operation condition of the in-vehicle device to be measured meets a prescribed operation condition during operation of the railroad cars 6 corresponds to, for example, a case where the temperature of the railroad cars 6, that is, the train 7 during the operation thereof is equal to or lower than a temperature set for grasping the operation state at a significantly low temperature or equal to or higher than a temperature set for grasping the operation state at a significantly high temperature. A prescribed operation condition may be set in association with a travel point such as a sharp curve or a steep slope along which the train 7 runs, for example.

When starting instruction to the in-vehicle devices, the control unit 23 notifies the auxiliary power supplies 1 via the communication unit 21 that instructions to the in-vehicle devices are to be started (step S102).

The control unit 23 selects each in-vehicle device in the instruction order on the basis of the information on the instruction order which is recorded in the recording unit 22, the information on the instruction order indicating what order to instruct the in-vehicle devices installed in the railroad cars 6 to start operating and to stop operating (step S103). In the case of the train 7 illustrated in FIG. 1, the information on the instruction order is as follow, for example: the air conditioner 4a→the air conditioner 4b→the air conditioner 4c→the air conditioner 4d→the air conditioner 4e→the air conditioner 4f→the brake compressor 3a→the brake compressor 3b→the brake compressor 3c→the brake compressor 3d→the brake compressor 3e→the brake compressor 3f. The control unit 23 selects one in-vehicle device at a time starting from the air conditioner 4a.

The control unit 23 instructs, via the communication unit 21, the selected in-vehicle device to start operating (step S104). In the example described above, the control unit 23 first instructs the air conditioner 4a to start operating. After a lapse of a prescribed period of time, that is, after the selected in-vehicle device has been operated for a predetermined period of time, the control unit 23 instructs, via the communication unit 21, the selected in-vehicle device to stop operating (step S105). The control unit 23 receives, via the communication unit 21, results of measurement of the output voltage and the output current with respect to the power outputted by the auxiliary power supply 1 during operation of the selected in-vehicle device, from the auxiliary power supply 1 (step S106). If all of the in-vehicle devices have not been selected (step S107: No), the control unit 23 selects a next in-vehicle device in accordance with the information on the instruction order (step S103). Subsequent operations are as described above.

If all the in-vehicle devices have been selected (step S107: Yes), that is, if selection of from the first selected one to the brake compressor 3f has been completed in the example described above, the control unit 23 outputs the received measurement results (step S108). For example, the control unit 23 may display the measurement results on the display unit 25 or may transmit the measurement results to a ground device which is not illustrated. In addition, the control unit 23 may record the measurement results in the recording unit 22, in order for a user to be able to read the measurement results from the recording unit 22 via a storage medium which is not illustrated. Thus, the control unit 23 performs at least one of the operations: recording the measurement results in the recording unit 22; displaying the measurement results on the display unit 25; and transmitting the measurement results to the ground device. In this process, the control unit 23 may also record in the recording unit 22, may display on the display unit 25, or may transmit to the ground device, information on the travel position of the train 7, the ambient temperature of the train 7, or the like in addition to the measurement results. Alternatively, the monitoring device 2 may collectively receive the measurement results from the auxiliary power supply 1 in the case of Yes in step S107 without receiving the measurement result from the auxiliary power supply 1 each time the operation for one in-vehicle device is completed.

Figure 4:
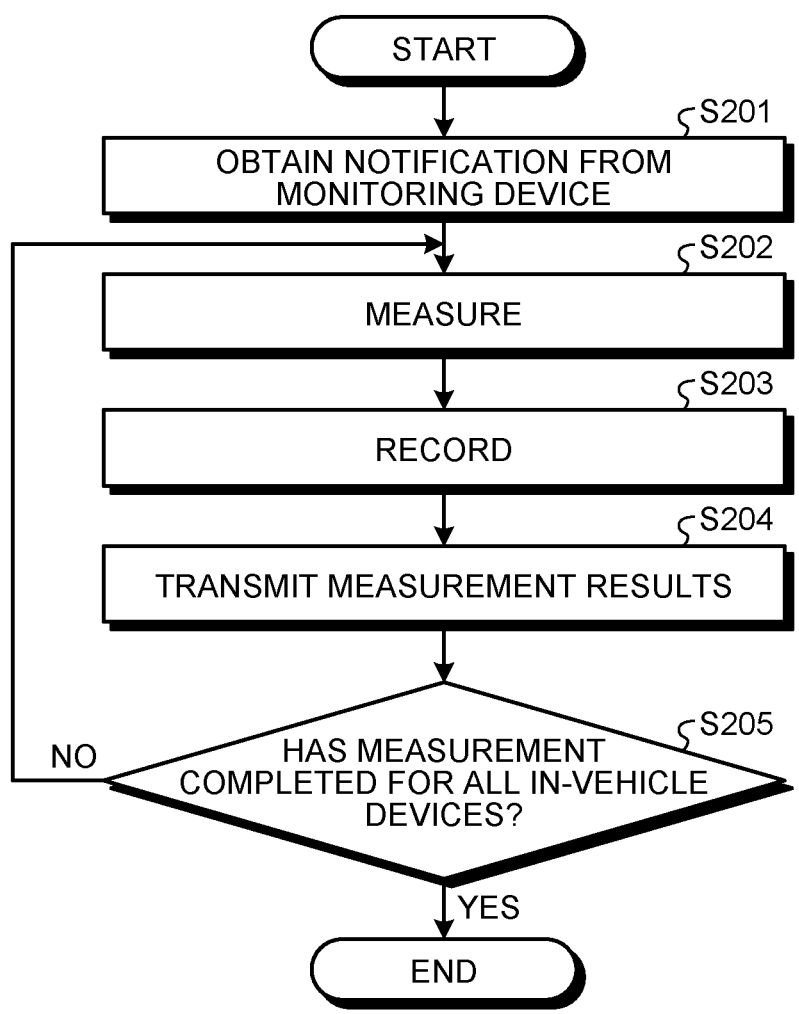
FIG. 4 is a flowchart illustrating an operation of the auxiliary power supply according to the first embodiment.

FIG. 4 is a flowchart illustrating an operation of an auxiliary power supply 1 according to the first embodiment. In the auxiliary power supply 1, upon acquiring notification of starting instructions to the in-vehicle devices from a monitoring device 2 via the communication unit 11 (step S201), the control unit 13 reads, from the recording unit 12, the information of the instruction order in which the in-vehicle devices installed in the railroad cars 6 are sequentially instructed to start operating and stop operating. The control unit 13 controls the operation of the measurement unit 15 on the basis of the information on the instruction order. The measurement unit 15 measures an output voltage and an output current of the power outputted from the power supplying unit 14 in the process of operation of the in-vehicle device selected by the monitoring device 2, on the basis of the control performed by the control unit 13 (step S202). The control unit 13 records the measurement results of the output voltage and the output current measured by the measurement unit 15 in the recording unit 12 (step S203). The control unit 13 transmits the measurement results of the output voltage and the output current that have been measured by the measurement unit 15 and recorded in the recording unit 12, to the monitoring device 2 via the communication unit (step S204). The signal format used for transmitting the measurement results from the auxiliary power supply 1 to the monitoring device 2 is set in advance in the auxiliary power supply 1 and the monitoring device 2 by a user or the like. Note that, when transmitting the measurement results to the monitoring device 2, the control unit 13 may perform control to transmit the measurement results to a ground device which is not illustrated. If the measurement has not completed for all the in-vehicle devices (step S205: No), the control unit 13 performs control to measure an output voltage and an output current of the power outputted from the power supplying unit 14 for the next in-vehicle device in accordance with the information on the instruction order (step S202). Subsequent operations are as described above.

If the measurement has been completed for all the in-vehicle devices (step S205: Yes), the control unit 13 terminates the operations. Alternatively, the auxiliary power supply 1 may collectively transmit the measurement results to the monitoring device 2 in the case of Yes in step S205 without transmitting the measurement result each time the measurement for one in-vehicle device is completed.

The auxiliary power supply 1 performs the measurement for two or more in-vehicle devices at the time of start of operation of the railroad cars 6, that is, the train 7, thereby making it possible to grasp the states of the individual in-vehicle devices immediately before the start of operation, and to reduce the possibility of failure of the in-vehicle device during the operation.

In addition, the auxiliary power supply 1 performs measurement for two or more in-vehicle devices when the railroad cars 6, that is, the train 7 is stored, thereby making it possible to acquired information for reference to be taken into account for maintenance menus for each in-vehicle device, and to achieve labor-saving of the maintenance.

In addition, the auxiliary power supply 1 performs measurement for two or more in-vehicle devices when the operation condition of the in-vehicle device to be measured meets a prescribed operation condition during operation of the railroad cars 6, thereby making it possible to perform the measurement under the condition of actual operation. The auxiliary power supply 1 cooperates with the monitoring device 2 to perform measurement when the in-vehicle device is in a specific state, or to perform measurement under a condition of a higher failure-possibility such as a specific air temperature, or the like, so as to intensively monitor some specific in-vehicle devices or device, thereby making it possible to collect information depending on the needs of the operator. Note that the auxiliary power supply 1 may perform measurement only for a specific in-vehicle device in a case where the operation condition of the in-vehicle device to be measured meets a prescribed operation condition during operation of the railroad cars 6. In this case, even if measured values have a different tendency from previously measured values, the auxiliary power supply 1 cannot identify which of the in-vehicle devices has an anomaly. Nevertheless, the auxiliary power supply 1 can detect that an anomaly has occurred in any of the in-vehicle devices, so that the supply 1 can issue an alert informing the user or the like of a sign of failure. The user who has noticed the alert can examine the train 7 in detail.

As described above, since the auxiliary power supply 1 and the monitoring device 2 cooperate with each other, the data collection system 8 can grasp the states of the in-vehicle devices installed in the railroad cars 6 more actively than a case where measurement is periodically performed at regular intervals. Note that, because the operation states of the train 7 differ from each other in the three patterns of the cases where the auxiliary power supply 1 performs measurements, the measurement results of the auxiliary power supply 1 may vary depending on the patterns. In such a case, it is sufficient that the user conduct operation to determine whether or not an anomaly has occurred in the train 7 on the basis of a measured value that is farthest from a measured value obtained in a normal state.

Next, a hardware configuration of the auxiliary power supply 1 will be described. In the auxiliary power supply 1, the communication unit 11 is a communicator. The recording unit 12 is a memory. The power supplying unit 14 is a power conversion circuit. The measurement unit 15 is a measuring instrument capable of measuring an electric voltage and an electric current. The control unit 13 is implemented by a processing circuit. The processing circuit may be constituted by a processor that is configured to execute programs stored in a memory and that memory, or by dedicated hardware.

Figure 5:
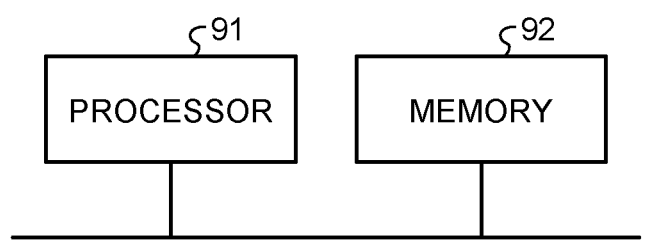
FIG. 5 is a diagram illustrating an example of a case where a processing circuit included in the auxiliary power supply according to the first embodiment is implemented by a processor and a memory.

FIG. 5 is a diagram illustrating an example of a case where the processing circuit with which the auxiliary power supply 1 according to the first embodiment is provided is implemented by a processor and a memory. In the case where the processing circuit is constituted by a processor 91 and a memory 92, the functions of the processing circuit of the auxiliary power supply 1 are implemented by software, firmware, or any combination of software and firmware. The software or firmware is described in their respective forms of programs and stored in the memory 92. The processing circuit implements the functions by reading and executing the programs stored in the memory 92 by the processor 91. Specifically, the processing circuit includes the memory 92 for storing programs based on which processes of the auxiliary power supply 1 are to be executed as a result. In other words, these programs cause a computer to execute the procedures and the methods of the auxiliary power supply 1.

Note that the processor 91 may be based on a central processing unit (CPU), a processing device, a computing device, a microprocessor, a microcomputer, a digital signal processor (DSP), or the like. In addition, the memory 92 may correspond to a nonvolatile or volatile semiconductor memory such as a random access memory (RAM), a read only memory (ROM), a flash memory, an erasable programmable ROM (EPROM), or an electrically EPROM (EEPROM: registered trademark), a magnetic disk, a flexible disk, an optical disk, a compact disc, a mini disc, a digital versatile disc (DVD) or the like, for example.

Figure 6:
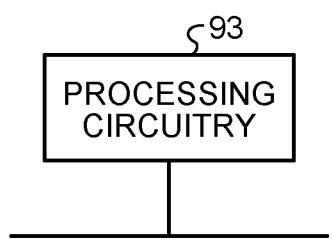
FIG. 6 is a diagram illustrating an example of a case where the processing circuit included in the auxiliary power supply according to the first embodiment is configured by dedicated hardware.

FIG. 6 is a diagram illustrating an example of a case where the processing circuit included in the auxiliary power supply 1 according to the first embodiment is configured by dedicated hardware. In the case where the processing circuit is configured by dedicated hardware, a processing circuitry or circuit 93 illustrated in FIG. 6 corresponds to a single circuit, a composite circuit, a programmed processor, a parallel-programmed processor, an application specific integrated circuit (ASIC), a field programmable gate array (FPGA), or any combination thereof, for example. The functions of the auxiliary power supply 1 may be implemented separately by the processing circuit 93 function by function, or may be implemented collectively by the processing circuit 93.

Note that some of the functions of the auxiliary power supply 1 may be implemented by dedicated hardware, and the remainder thereof may be implemented by software or firmware. In such a manner, the processing circuit is capable of implementing the above-described functions by dedicated hardware, software, firmware, or any combination thereof.

A hardware configuration of the monitoring device 2 will be described. In the monitoring device 2, the communication unit 21 is a communicator. The recording unit 22 is a memory. The operation unit 24 is an input interface such as a switch and/or a keyboard. The display unit 25 is a display exemplified by a liquid crystal display (LCD) or the like. The control unit 23 is implemented by a processing circuit. In a manner similar to the case of the auxiliary power supply 1, the processing circuit may be based on a processor that executes programs stored in a memory and the memory, or may be based on a dedicated hardware set.

As described above, according to the present embodiment, when a prescribed event has occurred in the train 7, the monitoring device 2 causes the in-vehicle devices to sequentially operate, and the auxiliary power supply 1 measures and records an output voltage and an output current from the auxiliary power supply 1 during operation of each of the in-vehicle devices. This enables the auxiliary power supply 1 to automatically record, at a desired timing, the state of the in-vehicle device installed in the railroad car 6. Furthermore, the monitoring device 2 receives an operation performed by the user, that is, specifically, an instruction to start measurement for each in-vehicle device, and in response to this reception the auxiliary power supply 1 can automatically record the states of the in-vehicle devices installed in the railroad cars 6 at a timing or timings desired by the user. In addition, the monitoring device 2 displays the measurement results of the auxiliary power supply 1, and by virtue of this displaying the user can monitor the states of the in-vehicle devices installed in the train 7 in real time.

Second Embodiment

In the first embodiment, the description has been given for a case where the auxiliary power supply 1 performs measurement using the monitoring device 2 as a starting point. In a second embodiment, description will be given for a case where measurement is performed using the auxiliary power supply 1 as a starting point.

In the second embodiment, the configuration of the train 7 is similar to that in the first embodiment illustrated in FIG. 1. In addition, the configuration of the data collection system 8 is similar to the configuration in the first embodiment illustrated in FIG. 2.

Figure 7:
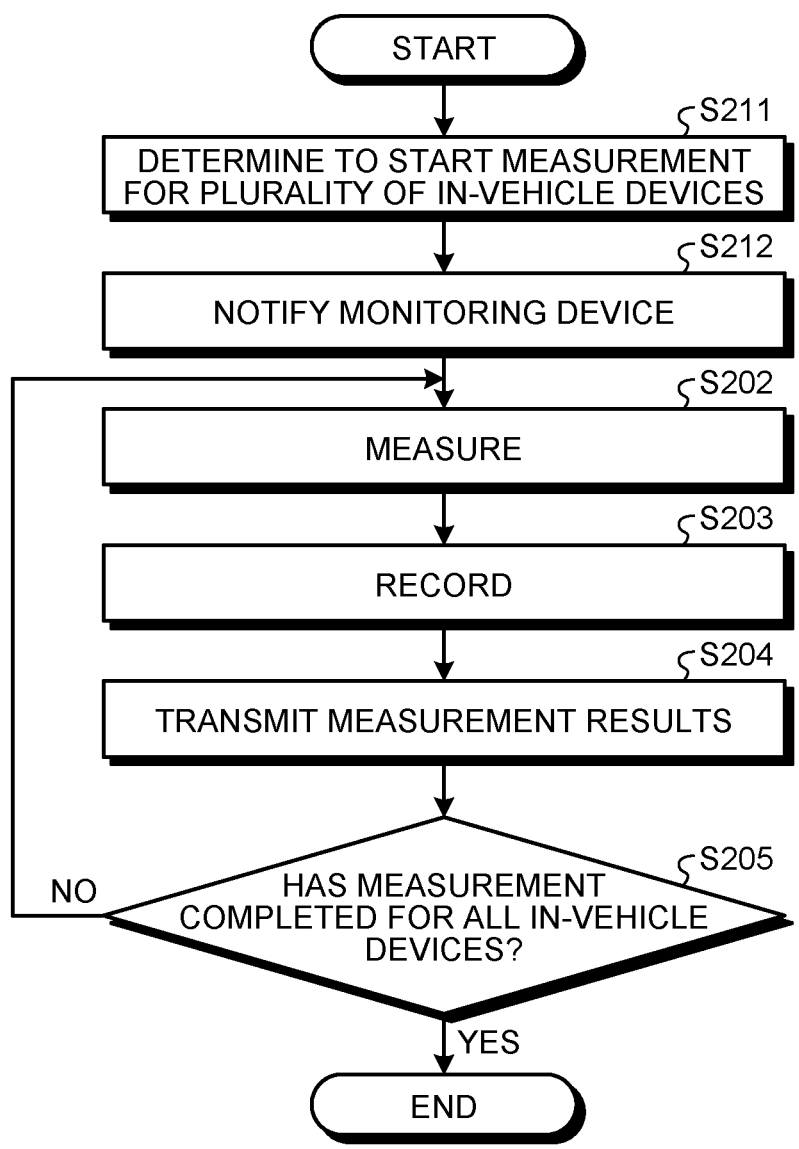
FIG. 7 is a flowchart illustrating an operation of an auxiliary power supply according to a second embodiment.

FIG. 7 is a flowchart illustrating an operation of an auxiliary power supply 1 according to the second embodiment. In the auxiliary power supply 1, when a prescribed event has occurred, the control unit 13 determines to start measurement for the in-vehicle devices (step S211). The prescribed event is a case where the railroad cars 6 are powered on or a case where the railroad cars 6 are stored. A prescribed event targeted by the auxiliary power supply 1 may also be referred to as a second event. The control unit 13 notifies the monitoring device 2 of an instruction to start measurement for the in-vehicle devices via the communication unit 11 (step S212). The operations in subsequent steps S202 to S205 are similar to the operations in the first embodiment illustrated in FIG. 4.

Figure 8:
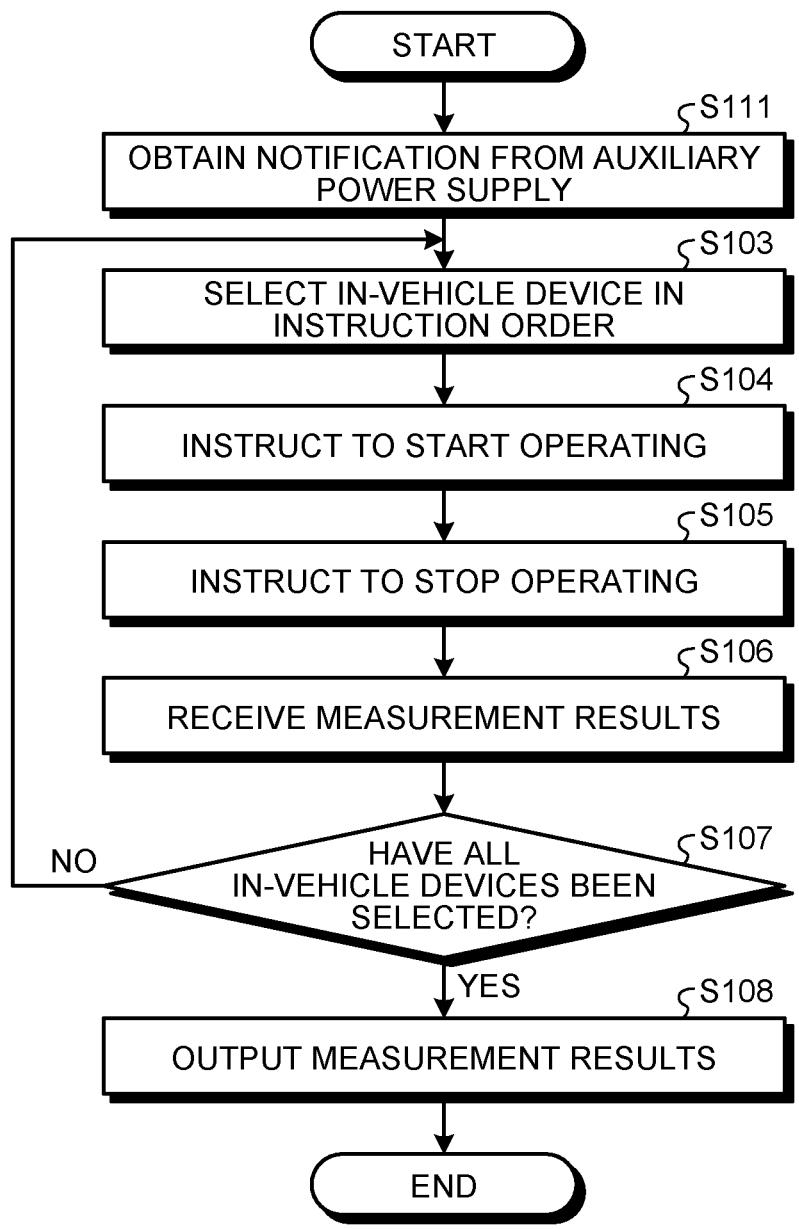
FIG. 8 is a flowchart illustrating an operation of a monitoring device according to the second embodiment.

FIG. 8 is a flowchart illustrating an operation of the monitoring device 2 according to the second embodiment. In the monitoring device 2, the control unit 23 acquires a notification that starting measurement for the in-vehicle devices has been determined, from an auxiliary power supply 1 via the communication unit 21 (step S111). The operations in subsequent steps S103 to S108 are similar to those in the first embodiment illustrated in FIG. 3.

As described above, according to the present embodiment, the configuration is made such that the auxiliary power supply 1 initiates the measurement of the output voltage and the output current. In this case as well, the same effects as those in the first embodiment can be produced.

Third Embodiment

In a third embodiment, the monitoring device 2 determines whether or not a measurement result obtained from the auxiliary power supply 1 is within a prescribed range. The description will be made using the first embodiment as an example, but is also applicable to the second embodiment.

In the third embodiment, the configuration of the train 7 is similar to the configuration in the first embodiment illustrated in FIG. 1. In addition, the configuration of the data collection system 8 is similar to the configuration in the first embodiment illustrated in FIG. 2.

Figure 9:
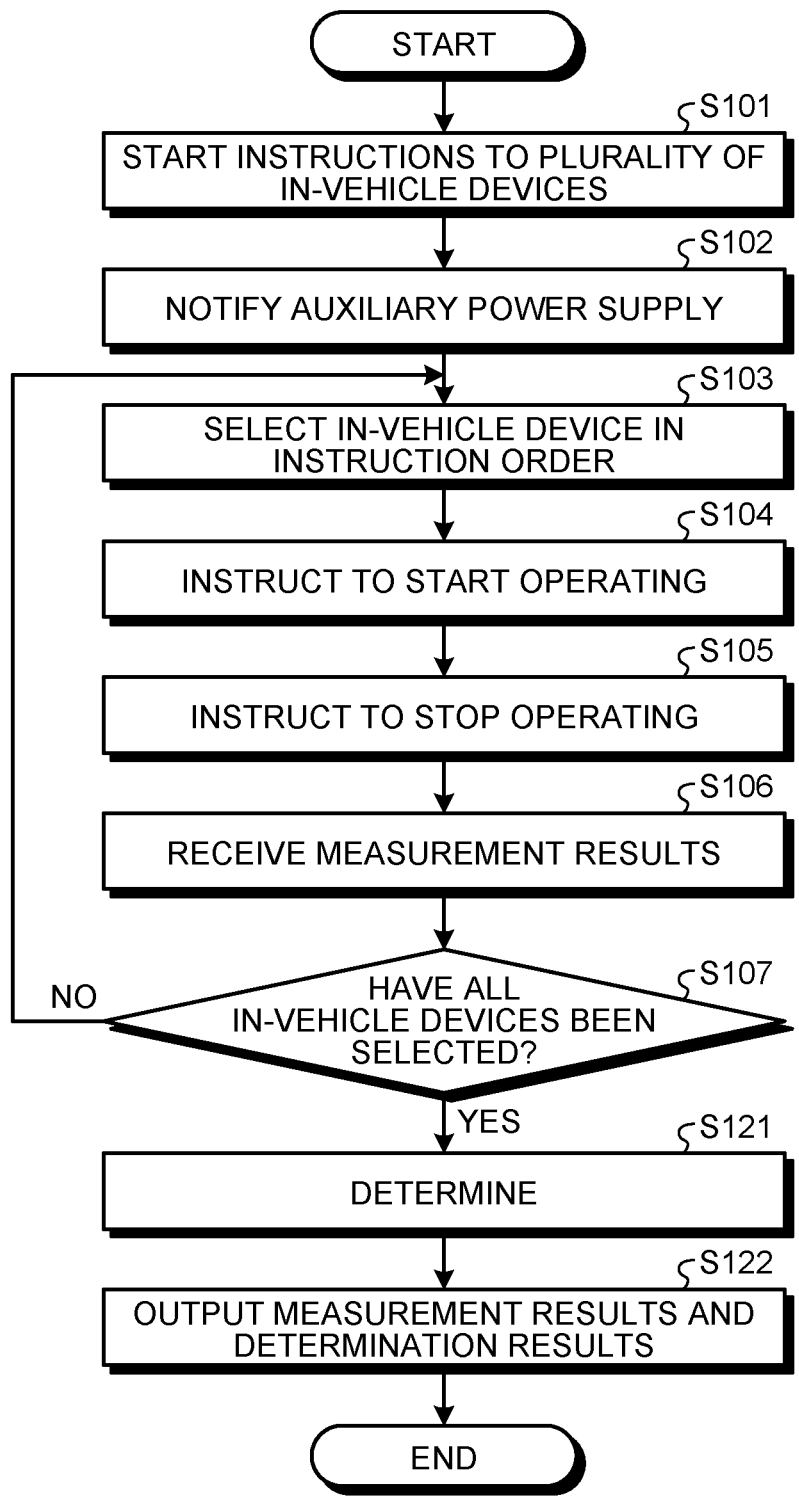
FIG. 9 is a flowchart illustrating an operation of a monitoring device according to a third embodiment.

FIG. 9 is a flowchart illustrating an operation of a monitoring device 2 according to the third embodiment. The operations from step S101 to step S107 are similar to those in the first embodiment illustrated in FIG. 3. In the monitoring device 2, the control unit 23 determines whether or not the measurement result received from the auxiliary power supply 1 is within the prescribed range (step S121). As described above, the auxiliary power supply 1 measures an output voltage and an output current while the brake compressors 3 and the air conditioners 4 installed in the railroad cars 6, that is, the train 7 are currently operating. For the brake compressors 3 and the air conditioners 4, the ranges of the output voltage and the output current of power outputted from the auxiliary power supply 1 during normal operation can be defined. For this reason, the monitoring device 2 records in advance information on the ranges of output voltage and output current of the auxiliary power supply 1 expected during normal operation of the brake compressor 3 and the ranges of output voltage and output current of the auxiliary power supply 1 expected during normal operation of the air conditioner 4, in the recording unit 22.

The control unit 23 outputs the received measurement results, and determination results that are results of the determination (step S122). The control unit 23 may display the measurement results and the determination results on the display unit 25 or may transmit the measurement results and the determination results to a ground device, which is not illustrated, for example. In addition, the control unit 23 may record the measurement results and the determination results in the recording unit 22, so as to enable a user to read the measurement results and the determination results from the recording unit 22 via a recording medium, which is not illustrated. Specifically, the control unit 23 performs at least one of the operations: recording the measurement results and the determination results in the recording unit 22; displaying the measurement results and the determination results on the display unit 25; and transmitting the measurement results and the determination results to a ground device.

Note that, in the third embodiment, the operations of the auxiliary power supply 1 are similar to those in the first embodiment illustrated in FIG. 4.

As described above, according to the present embodiment, the monitoring device 2 is configured to determine whether or not the measurement result received from the auxiliary power supply 1 is one in a good state, that is, whether or not it is within the preset range. This enables the monitoring device 2 to readily display the states of the in-vehicle devices installed in the train 7 for the user. Note that the method for determination of a measurement result performed in the control unit 23 of the monitoring device 2 may be based on a method other than determination of whether the measurement result is within the prescribed range, that is comparison between the measurement result and a threshold. The control unit 23 of the monitoring device 2 may perform determination on the measurement results on the basis of the shapes of waves expressing the output voltage and the output current on a time series basis, may perform determination on the measurement results on the basis of distributions of singular values calculated using previous measurement results of the output voltage and the output current, or may perform determination on the measurement results on the basis of the gradients of increase or decrease of the measurement results on a time series basis, for example.

Fourth Embodiment

In a fourth embodiment, the auxiliary power supply 1 determines whether or not the measurement result is within the prescribed range. The description will be made using the first embodiment as an example, but is also applicable to the second embodiment.

In the fourth embodiment, the configuration of the train 7 is similar to the configuration in the first embodiment illustrated in FIG. 1. In addition, the configuration of the data collection system 8 is similar to the configuration in the first embodiment illustrated in FIG. 2.

Figure 10:
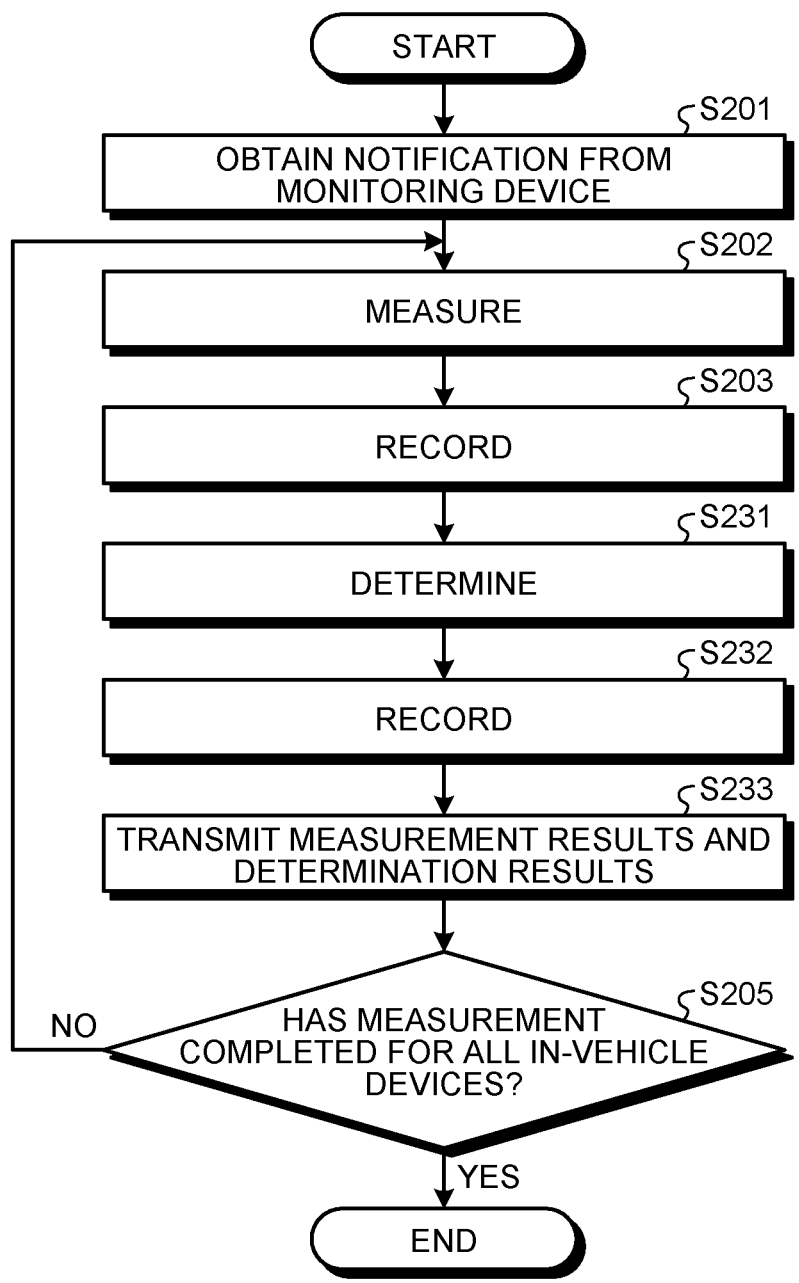
FIG. 10 is a flowchart illustrating an operation of an auxiliary power supply according to a fourth embodiment.

FIG. 10 is a flowchart illustrating an operation of an auxiliary power supply 1 according to the fourth embodiment. The operations of from step S201 to step S203 are similar to those in the first embodiment illustrated in FIG. 4. In the auxiliary power supply 1, the control unit 13 determines whether or not the measurement result is within a prescribed range (step S231). The method for determination performed by the control unit 13 is similar to the method for determination performed by the control unit 23 of the monitoring device 2 in the third embodiment described above. The control unit 13 records the determination results that are results of determination, in the recording unit 12 (step S232). The control unit 13 transmits the measurement results of the output voltage and the output current measured by the measurement unit 15 and the determination results to the monitoring device 2 via the communication unit 11 (step S233). The signal format used for transmitting the measurement results and the determination results from the auxiliary power supply 1 to the monitoring device 2 is set in advance in the auxiliary power supply 1 and the monitoring device 2 by a user or the like. Note that, when transmitting the measurement results and the determination results to the monitoring device 2, the control unit 13 may transmit the measurement results and the determination results to a ground device, which is not illustrated. The determination result can be expressed by information of OK or NG in one-bit information, that is, "0" or "1". The operation in subsequent step S205 is similar to the operation in the first embodiment illustrated in FIG. 4.

Figure 11:
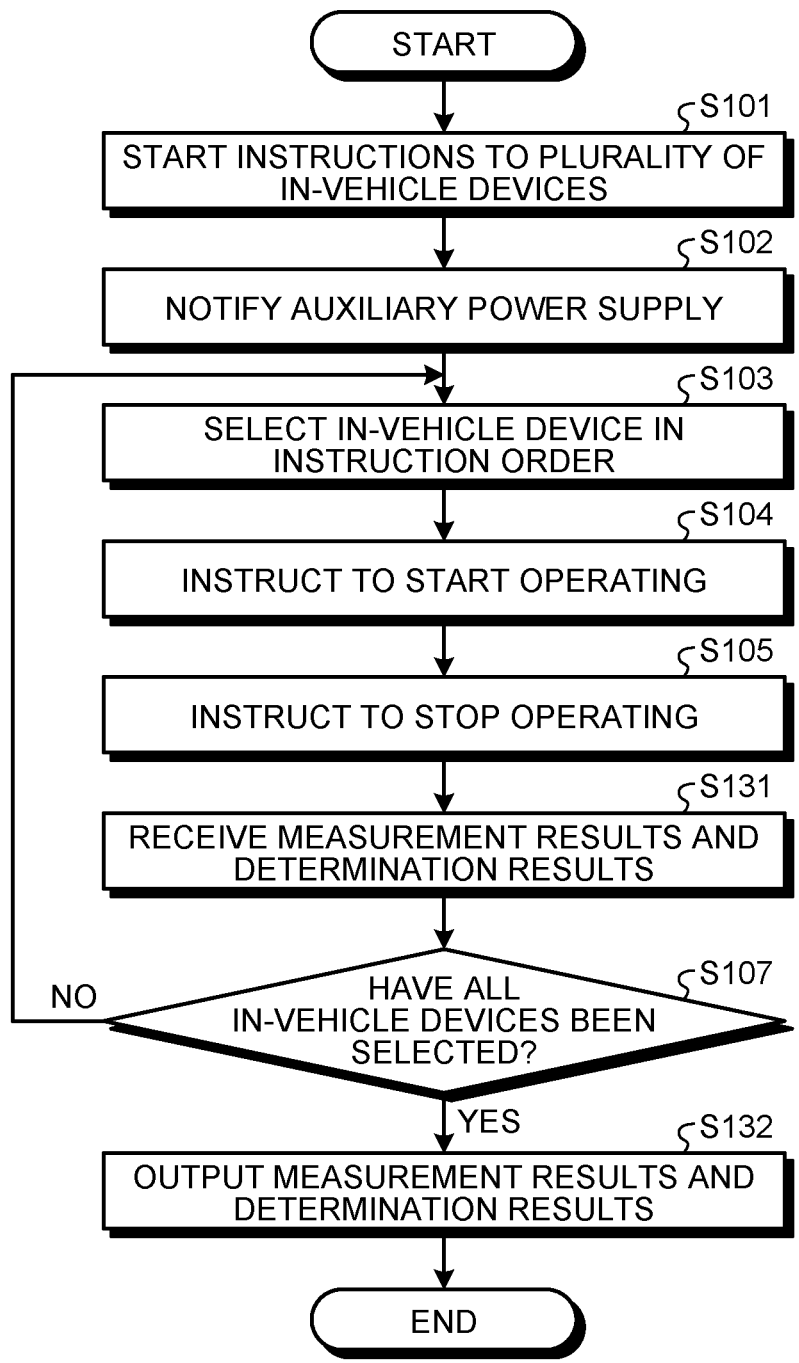
FIG. 11 is a flowchart illustrating an operation of a monitoring device according to the fourth embodiment.

FIG. 11 is a flowchart illustrating an operation of the monitoring device 2 according to the fourth embodiment. The operations of from step S101 to step S105 are similar to those in the first embodiment illustrated in FIG. 3. The control unit 23 receives, via the communication unit 21, from the auxiliary power supply 1, results of measurement of the output voltage and the output current with respect to the power outputted by the auxiliary power supply 1 during operation of the selected in-vehicle device and results of determination on whether or not the measurement results are respectively within the prescribed ranges (step S131). If all of the in-vehicle devices have not been selected (step S107: No), the control unit 23 selects the next one of the in-vehicle devices in accordance with the information on the instruction order (step S103). Subsequent operations are as described above. If all the in-vehicle devices have been selected (step S107: Yes), that is, if selection of from the first selected one to the brake compressor 3f has been completed in the example described above, the control unit 23 outputs the received measurement results and the determination results (step S132). The control unit 23 may display the measurement results and the determination results on the display unit 25 or may transmit the measurement results and the determination results to a ground device, which is not illustrated, for example. In addition, the control unit 23 may record the measurement results and the determination results in the recording unit 22, so as to enable a user to read the measurement results and the determination results from the recording unit 22 via a recording medium, which is not illustrated. Specifically, the control unit 23 is configured to perform at least one of the operations: recording the measurement results and the determination results in the recording unit 22; displaying the measurement results and the determination results on the display unit 25; and transmitting the measurement results and the determination results to the ground device. In this process, the control unit 23 may also record in the recording unit 22, display on the display unit 25, and transmit to the ground device, information on the travel position of the train 7, the ambient temperature of the train 7, and so on in addition to the measurement results and the determination results.

As described above, according to the present embodiment, the auxiliary power supply 1 determines whether or not the measurement results are those in good states, that is, each of them is within a prescribed range, and transmits the thus-obtained determination results to the monitoring device 2. In this case as well, the same effects as those in the third embodiment can be produced.

The configurations presented in the above embodiments play a role of examples of contents of the present invention, and can each be combined with other publicly known techniques and partly omitted and/or modified without departing from the scope of the present invention.

REFERENCE SIGNS LIST 1, 1a, 1b auxiliary power supply; 2, 2a, 2b monitoring device; 3a to 3f brake compressor; 4a to 4f air conditioner; 5 communication line; 6a to 6f railroad car; 7 train; 8 data collection system; 11, 21 communication unit; 12, 22 recording unit; 13, 23 control unit; 14 power supplying unit; 15 measurement unit; 24 operation unit; 25 display unit.

The invention claimed is:

1. A data collection system comprising:
a monitoring device to sequentially instruct two or more in-vehicle devices installed in a railroad car to start operating and to stop operating, the two or more in-vehicle devices being installed in a plurality of railroad cars; and
an auxiliary power supply to sequentially measure an output voltage and an output current supplied to the two or more in-vehicle devices by the auxiliary power supply while the two or more in-vehicle devices operate in turns in accordance with an instruction from the monitoring device, and record measurement results, and wherein the monitoring device selects one in-vehicle device at a time from the two or more in-vehicle devices based on an instruction order to start operating and stop operating, the instruction order indicating an order of selecting one of the two or more in-vehicle devices installed in the plurality of railroad cars to start operating and stop operating, and wherein the instruction order does not select an other of the two or more in-vehicle devices to start operating and stop operating until each of the selected one of the two or more in-vehicles devices installed in the plurality of railroad cars has been instructed to start operating and stop operating.

2. The data collection system according to claim 1, wherein
when a first event prescribed has occurred, when an instruction from a user has been received, or when an instruction from the auxiliary power supply has been received, the monitoring device starts instruction to the two or more in-vehicle devices.

3. The data collection system according to claim 2, wherein
the first event is a case where the railroad car is powered on, a case where the railroad car is stored, or a case where an operation condition of an in-vehicle device to be measured meets a prescribed operation condition during operation of the railroad car.

4. The data collection system according to claim 1, wherein when a second event prescribed has occurred, the auxiliary power supply instructs the monitoring device to start instruction to the two or more in-vehicle devices.

5. The data collection system according to claim 4, wherein
the second event is a case where the railroad car is powered on or a case where the railroad car is stored.

6. The data collection system according to claim 1, wherein
the auxiliary power supply transmits the measurement results to the monitoring device, and
the monitoring device accordingly performs at least one of an operation of recording the measurement results, an operation of displaying the measurement results, and an operation of transmitting the measurement results to a ground device.

7. The data collection system according to claim 6, wherein
the monitoring device determines whether or not the measurement results are within a prescribed range, and accordingly performs at least one of an operation of recording determination results, an operation of displaying the determination results, and an operation of transmitting the determination results to a ground device.

8. The data collection system according to claim 6, wherein
the auxiliary power supply determines whether or not the measurement results are within a prescribed range, and transmits determination results to the monitoring device, and
the monitoring device accordingly performs at least one of an operation of recording the determination results, an operation of displaying the determination results, and an operation of transmitting the determination results to a ground device.

9. The data collection system according to claim 1, wherein the monitoring device based on the instruction order is configured to instruct a selected in-vehicle device of the two or more in-vehicle devices to start operating for a predetermined time, the monitoring device instructs the selected in-vehicle device of the two or more in-vehicle devices to stop operating after the elapse of the predetermined time, and the results of the output voltage and the output current supplied with respect to power outputted by the auxiliary power supply during operation of the selected in-vehicle device are measured, and if all of the two or more in-vehicle devices have not been selected, the monitoring device is configured based on the instruction order to select a next in-vehicle device of the two or more in-vehicle devices to start operating and stop operating.

10. An auxiliary power supply comprising:
a communication unit to communicate with a monitoring device that sequentially instructs two or more in-vehicle devices installed in a railroad car to start operating and stop operating, the two or more in-vehicle devices being installed in a plurality of railroad cars;
a power supplying unit to supply power to the in-vehicle devices;
a measurement unit to sequentially measure an output voltage and an output current from the power supplying unit supplied to the two or more in-vehicle devices by the power supplying unit while the two or more in-vehicle devices operate in turns in accordance with an instruction from the monitoring device, and wherein the monitoring device selects one in-vehicle device at a time from the two or more in-vehicle based on an instruction order to start operating and stop operating, the instruction order indicating an order of selecting one of the two or more in-vehicle devices installed in the plurality of railroad cars to start operating and stop operating, and wherein the instruction order does not select an other of the two or more in-vehicle devices to start operating and stop operating until each of the selected one of the two or more in-vehicles devices installed in the plurality of railroad cars has been instructed to start operating and stop operating;
a recording unit to record measurement results that are results of measurement performed by the measurement unit, and information on the instruction order in which the monitoring device instructs the two or more in-vehicle devices; and
a control unit to instruct the measurement unit on a measurement timing, and record the measurement results measured by the measurement unit in the recording unit on the basis of the information on the instruction order.

11. The auxiliary power supply according to claim 10, wherein
when a prescribed event has occurred, the control unit instructs the monitoring device to start instruction to the two or more in-vehicle devices.

12. The auxiliary power supply according to claim 11, wherein
the prescribed event is a case where the railroad car is powered on or a case where the railroad car is stored.

13. The auxiliary power supply according to claim 10, wherein
the control unit transmits the measurement results recorded in the recording unit to the monitoring device via the communication unit.

14. The auxiliary power supply according to claim 13, wherein
the control unit determines whether or not the measurement results are within a prescribed range, and transmits determination results to the monitoring device via the communication unit.

15. A monitoring device comprising:
a recording unit in which information on an instruction order is recorded, the information indicating an order in which two or more in-vehicle devices installed in a railroad car are sequentially instructed to start operating and to stop operating, the two or more in-vehicle devices being installed in a plurality of railroad cars;
a control unit to sequentially instruct the two or more in-vehicle devices to start operating and to stop operating on the basis of the information on the instruction order, and wherein the control unit selects one in-vehicle device at a time from the two or more in-vehicle devices to start operating and stop operating, the instruction order indicating an order of selecting one of the two or more in-vehicle devices installed in the plurality of railroad cars to start operating and stop operating, and wherein the instruction order does not select an other of the two or more in-vehicle devices to start operating and stop operating until each of the selected one of the two or more in-vehicles devices installed in the plurality of railroad cars has been instructed to start operating and stop operating; and
a communication unit to communicate with an auxiliary power supply that sequentially measures an output voltage and an output current supplied to the two or more in-vehicle devices by the auxiliary power supply while the in-vehicle devices operate in turns and records measurement results.

16. The monitoring device according to claim 15, wherein when a prescribed event has occurred, when an instruction from a user has been received, or when an instruction from the auxiliary power supply has been received, the control unit starts instruction to the two or more in-vehicle devices.

17. The monitoring device according to claim 16, wherein the prescribed event is a case where the railroad car is powered on, a case where the railroad car is stored, or a case where an operation condition of an in-vehicle device to be measured meets a prescribed operation condition during operation of the railroad car.

18. The monitoring device according to claim 15, wherein the control unit receives the measurement results from the auxiliary power supply via the communication unit, and accordingly performs at least one of an operation of recording the measurement results in the recording unit, an operation of displaying the measurement results on a display unit, and an operation of transmitting the measurement results to a ground device.

19. The monitoring device according to claim 18, wherein the control unit determines whether or not the measurement results are within a prescribed range, and accordingly performs at least one of an operation of recording determination results in the recording unit, an operation of displaying the determination results on a display unit, and an operation of transmitting the determination results to a ground device.

20. The monitoring device according to claim 18, wherein the control unit receives determination results of determination on whether or not the measurement results are within a prescribed range from the auxiliary power supply via the communication unit, and accordingly performs at least one of an operation of recording the determination results in the recording unit, an operation of displaying the determination results on a display unit, and an operation of transmitting the determination results to a ground device.

* * * * *